United States Patent
McAllister et al.

(10) Patent No.: US 7,231,833 B2
(45) Date of Patent: Jun. 19, 2007

(54) BOARD DEFLECTION METROLOGY USING PHOTOELECTRIC AMPLIFIERS

(75) Inventors: Alan C. McAllister, Hillsboro, OR (US); Wade W. Hezeltine, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 610 days.

(21) Appl. No.: 10/405,884

(22) Filed: Apr. 1, 2003

(65) Prior Publication Data

US 2004/0197102 A1  Oct. 7, 2004

(51) Int. Cl.
*G01L 1/24* (2006.01)

(52) U.S. Cl. ...................................................... 73/800

(58) Field of Classification Search ................. 73/800, 73/849–854 P
See application file for complete search history.

(56) References Cited

U.S. PATENT DOCUMENTS

| | | | |
|---|---|---|---|
| 5,231,882 A | | 8/1993 | Bertele et al. |
| 5,461,323 A | * | 10/1995 | Yanagi et al. ................ 324/754 |
| 5,489,985 A | * | 2/1996 | Mochida et al. ............ 356/398 |
| 5,535,903 A | * | 7/1996 | Fujioka ........................ 216/13 |
| 5,567,884 A | * | 10/1996 | Dickinson et al. ............ 73/814 |
| 5,736,646 A | * | 4/1998 | Dickinson et al. ............ 73/814 |
| 5,789,682 A | * | 8/1998 | Dickinson et al. ............ 73/814 |
| 6,839,883 B2 | * | 1/2005 | Ahrikencheikh ................ 716/1 |
| 2003/0002123 A1 | * | 1/2003 | Worner et al. .............. 359/216 |

FOREIGN PATENT DOCUMENTS

| | | |
|---|---|---|
| DE | 42 18 515 A1 | 12/1993 |
| DE | 198 47 913 A1 | 5/1999 |
| WO | PCT/US2004/007632 | 7/2004 |

* cited by examiner

*Primary Examiner*—Max Noori
(74) *Attorney, Agent, or Firm*—Blakely, Sokoloff, Taylor & Zafman LLP

(57) ABSTRACT

Manufacturers test printed circuit boards (PCB) to ensure that all components have been soldered to the correctly. Some tests cause the boards to deflect, which can damage component-to-board interfaces (i.e., solder joints) or components. Embodiments of the present invention measure the amount of PCB deflection before, during, and after the PCB is subject to mechanical load using photoelectric amplifiers, which send and receive light beams to targets mounted on the PCB surface through optical fibers and lenses mounted in a head assembly. The intensity of received light beams are proportional to analog voltages output by the photoelectric amplifiers and to the distance between the head assemblies and the targets. A data acquisition system converts the analog voltages to digital voltages and a software interface correlates the digital voltages to PCB deflection/displacement. A GUI displays deflection before, during, and after the PCB is subject to mechanical load.

19 Claims, 7 Drawing Sheets

BOARD DEFLECTION METROLOGY USING PHOTOELECTRIC AMPLIFIERS

BACKGROUND

1. Field

Embodiments of the present invention relate to board handling equipment and in particular to board handling equipment for handling printed circuit boards with surface mounted integrated circuits.

2. Discussion of Related Art

When products are sold to original equipment manufacturers (OEMs) the products are usually accompanied by specifications. The specifications typically include acceptable operating conditions, connection recommendations, direct current (DC) specifications, alternating current (AC) specifications, etc. The product is commonly warranted to perform according to the specifications.

Product manufacturers perform certain tests to guarantee the product complies with the specifications. For example, manufacturers of printed circuit boards (PCB) with soldered components test the electrical connections throughout a board to ensure that all components have been soldered to the board correctly. Some tests require boards to be plugged in and removed from connectors repeatedly. The equipment used for these and other tests exert a significant amount of force on the board. The testing equipment can twist and bend the board as well.

When the force on the board is not well distributed or when the board is not well supported the board may be subject to deflection. As the board deflects, component-to-board interface (i.e., solder joints) can become damaged or the components can become damaged. If the board passes its testing and upon removal from the board handling equipment a component becomes damaged or the solder joints open, for example, the manufacturer would likely ship the board to customers without knowing that the board is defective. The shipped, defective board could cause intermittent problems in computer systems, which are difficult to isolate and repair. In some instances, the board may not function at all. As technology advance and components become more delicate, the likelihood of damaging components or compromising solder joints increases.

BRIEF DESCRIPTION OF THE DRAWINGS

In the drawings, like reference numbers generally indicate identical, functionally similar, and/or structurally equivalent elements. The drawing in which an element first appears is indicated by the leftmost digit(s) in the reference number, in which.

DETAILED DESCRIPTION OF THE ILLUSTRATED EMBODIMENTS

Figure 1:
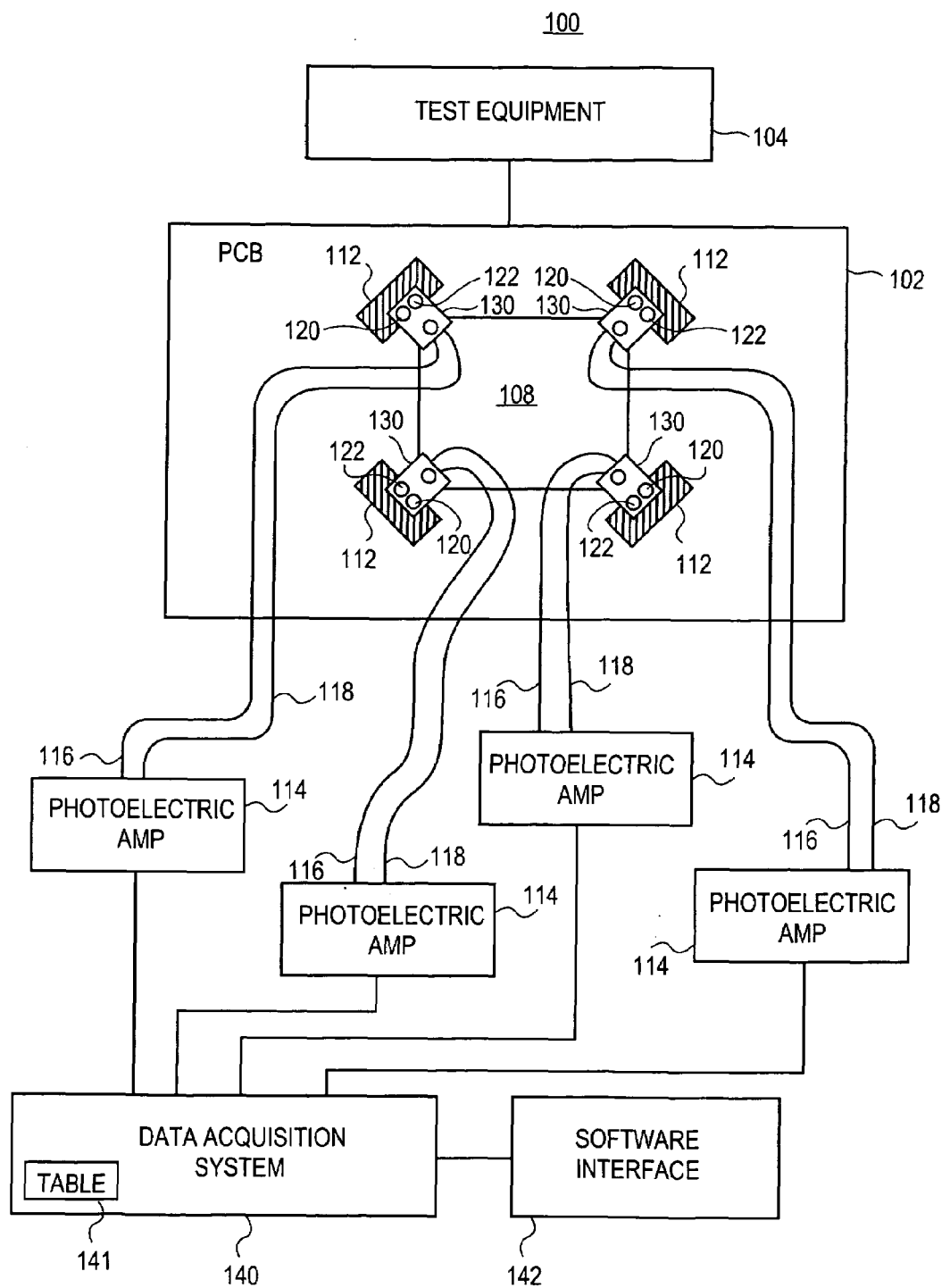
FIG. 1 is schematic diagram of a deflection metrology system according to an embodiment of the present invention.

FIG. 1 is schematic diagram of a printed circuit board (PCB) deflection metrology system 100 according to an embodiment of the present invention. The system 100 includes a printed circuit board (PCB) 102 and test equipment 104 coupled to the PCB 102.

The PCB 102 can be any suitable printed circuit board capable of being subjected to mechanical load, vibration, shock, etc., or simulation thereof. In one embodiment of the present invention, the PCB 102 includes a component 108 (e.g., chipset, device, socket) soldered to the surface of the PCB 102 using surface mount technology (SMT). The component 108 may be any known ball grid array (BGA) mounted component.

The test equipment 104 may be any suitable equipment capable of subjecting the PCB 102 to mechanical load, vibration, shock, etc., in an effort to cause the PCB 102 to experience deflection. Alternatively, the test equipment 104 may be any suitable equipment capable of simulating subjecting the PCB 102 to mechanical load, vibration, shock, etc., in an effort to cause the PCB 102 to experience deflection. Suitable equipment includes automated or manual in-circuit test equipment or external functional test equipment, for example.

The example deflection metrology system 100 includes one or more targets 112 attached to the surface of the PCB 102. The targets 112 may be any suitable thin pieces of tape, paper, etc., that reflect/refract a substantial amount of light in a substantially uniform manner. In one embodiment, the targets 112 are small white labels, available from Avery Dennison of Brea, Calif., for example, glued to the surface of the PCB 102. In an alternative embodiment, the targets 112 are small pieces of reflective tape available from 3M in St. Paul, Minn.

The example deflection metrology system 100 includes optical circuitry such as one or more photoelectric amplifiers 114 coupled to corresponding optical fibers 116 and optical fibers 118. The optical fibers 116 are coupled to corresponding lenses 120. The optical fibers 118 are coupled to corresponding lenses 122. The lenses 120 and 122 are housed in one or more head assemblies 130. The head assembly 130 may be mounted to the component 108 in any manner suitable to secure the head assembly 130 to the component 108 (e.g., close to the perimeter of the component 108).

A suitable implementation of the photoelectric amplifier 114, optical fibers 116 and 118, lenses 120 and 122, and head assembly 130 may be a Banner P32C2 Convergent LED Fiber available from KOM Lamb in Amherst, N.Y. Of course, any suitable module or discrete light beam transmitter, light beam receiver, optical fiber, and lens, could be used to implement embodiments of the present invention. After reading the description herein, a person of ordinary skill in the relevant art will readily recognize how to implement other embodiments.

The example deflection metrology system 100 includes a data acquisition system 140 coupled to each photoelectric amplifier 114. In one embodiment, the data acquisition system 140 may be an off-the-shelf DAQ Pad 6020E available from National Instruments located in Austin, Tex. Of course, other data acquisition systems and techniques exist (e.g., off-the-shelf PCMCIA card that plugs into a laptop (DAQP-16 Analog Input PCMCIA Card available from Quatec in Akron, Ohio)) and embodiments of the present invention are not limited to the type of data acquisition system.

The example deflection metrology system 100 includes a software interface 142 coupled to the data acquisition system 140. The example software interface 142 is may be created using a suitable programming language. In one embodiment, the software interface 142 may be a custom Virtual Instrument written in LabView available from National Instruments Corp., located in Austin, Tex. In an alternative embodiment, the software interface 142 may be written in Hewlett Packard Visual Engineering Environment (HP VEE) for Windows available from Hewlett Packard in Palo Alto, Calif. In another embodiment, the software interface 142 may be written in Visual Basic available from Microsoft in Redmond, Wash. Of course, the software interface 142 may be written in other suitable languages, such as LabWindows\CVI, and ComponentWorks from National Instruments Corp., and DasyLab available from DasyTec GMBH in Amherst, N.H.

Figure 2A:
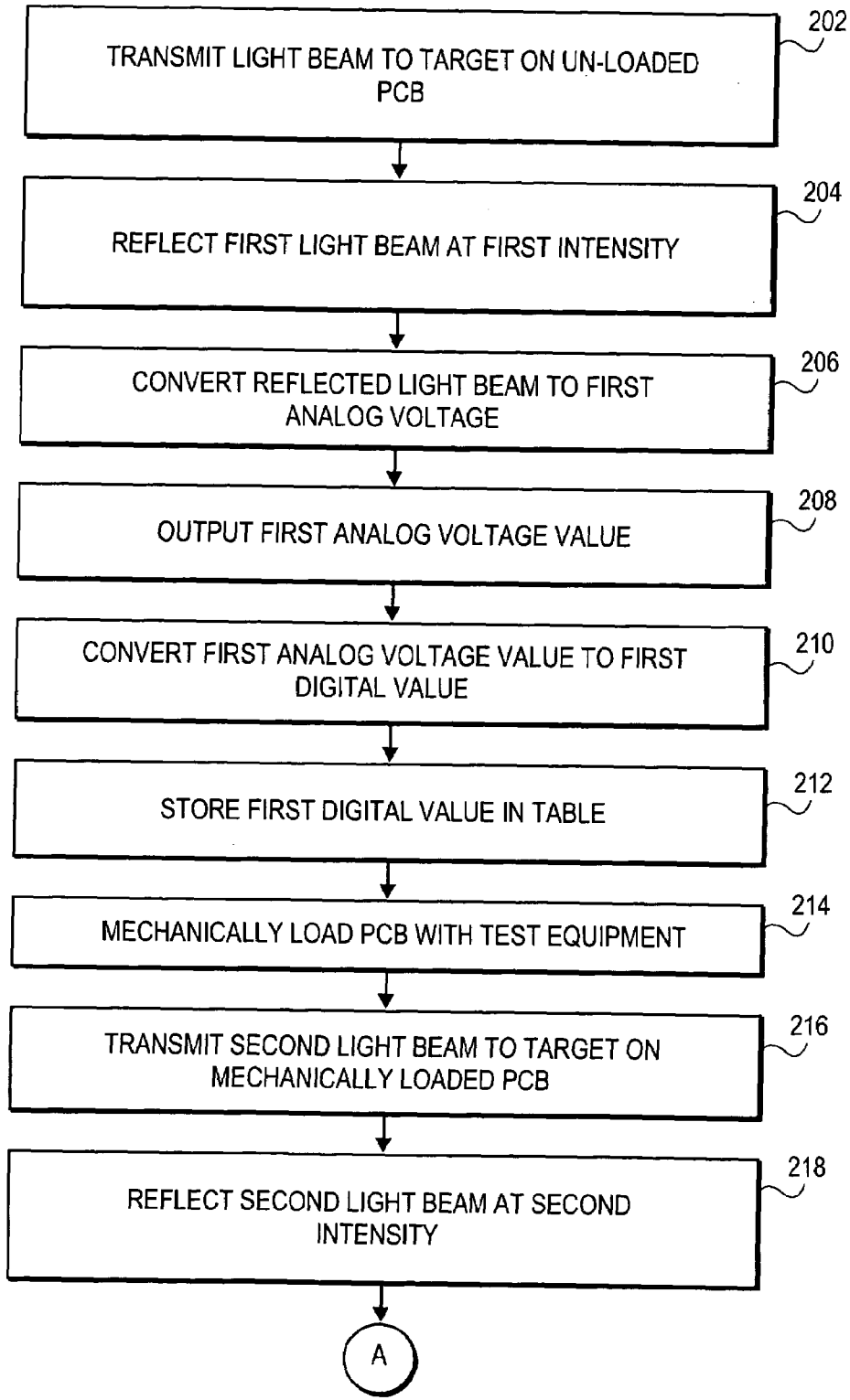
FIG. 2 is a flowchart of a PCB deflection metrology process according to an embodiment of the present invention.
Figure 2B:
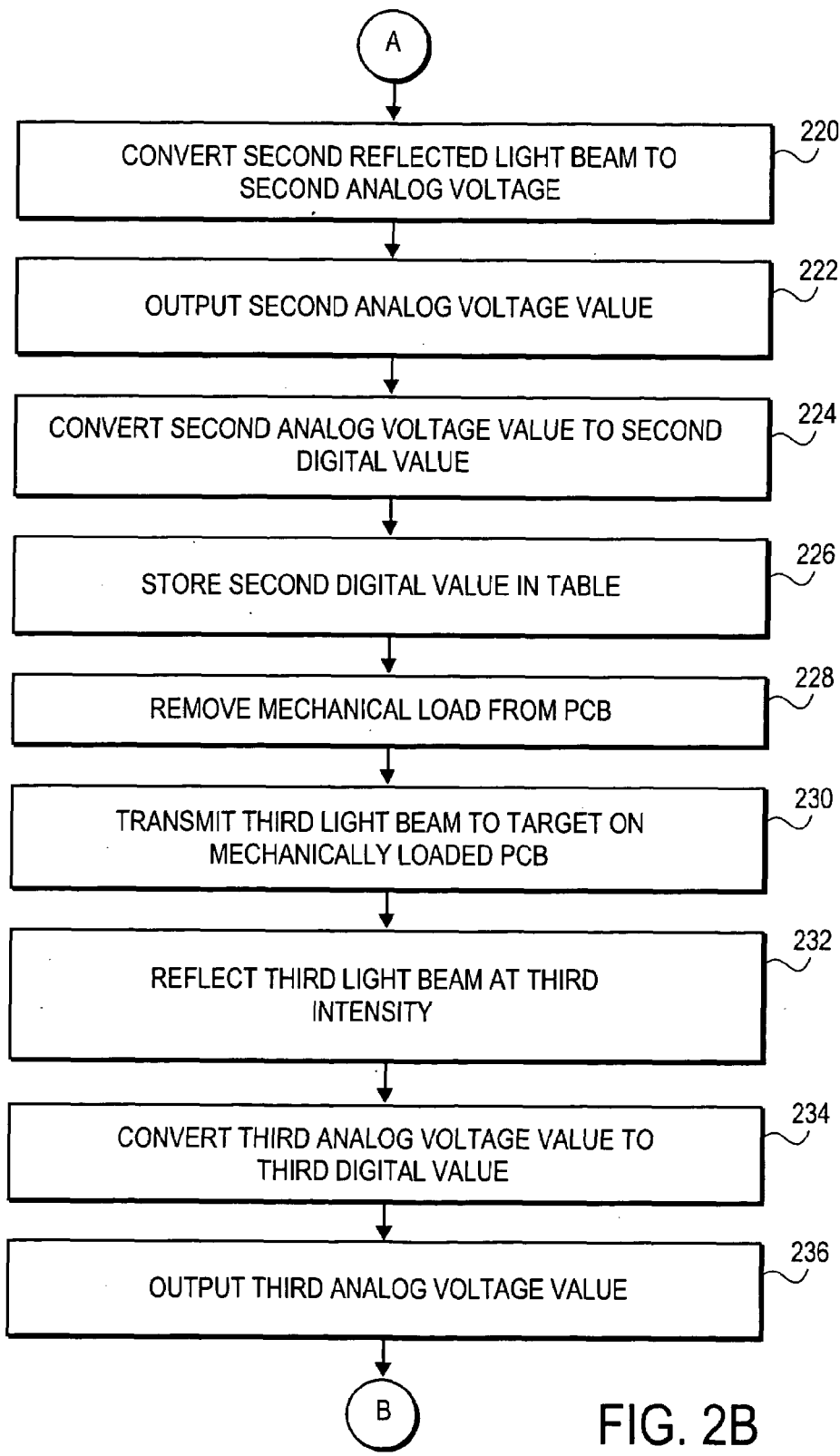
Figure 2C:
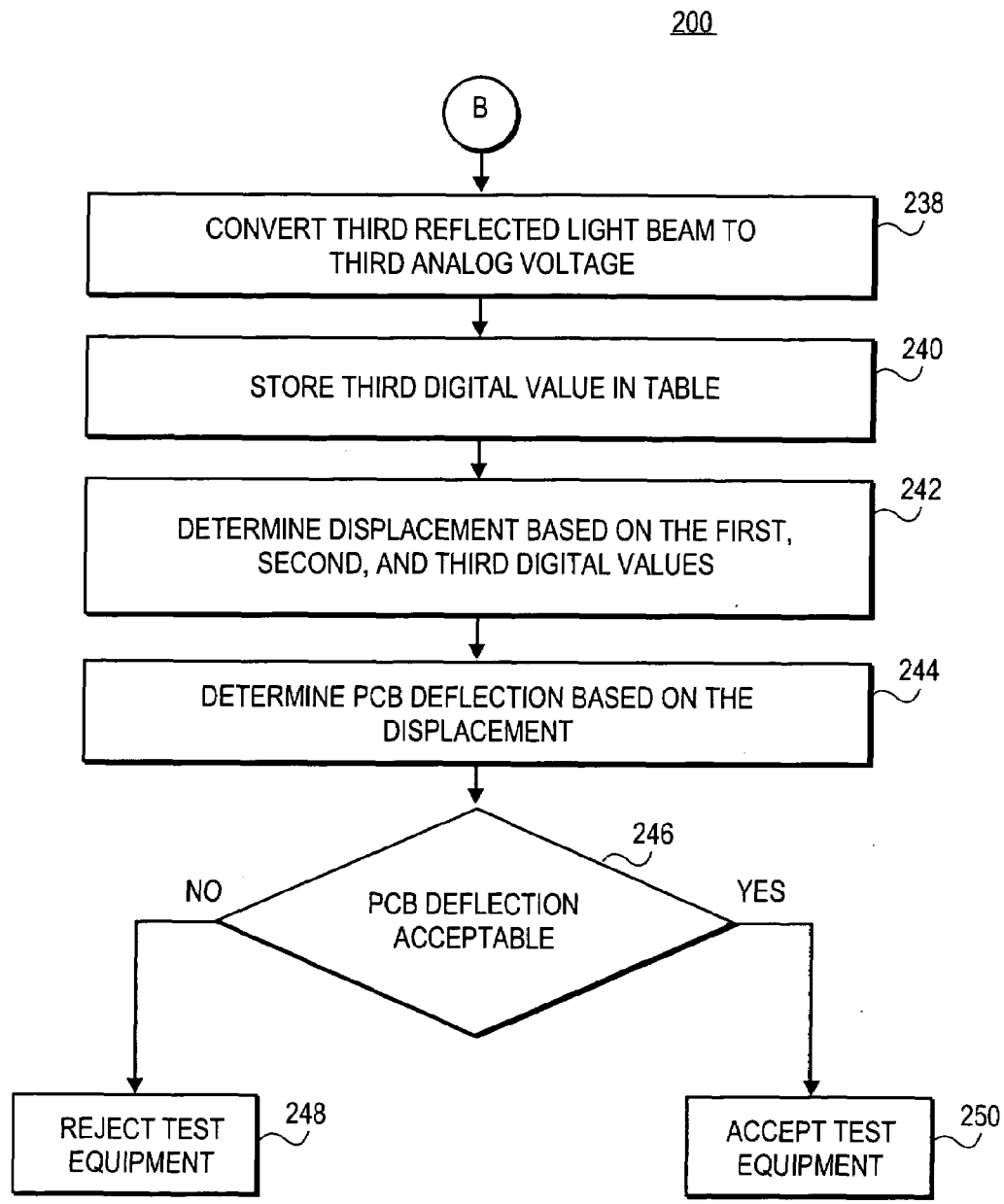

FIG. 2 is a flowchart of a PCB deflection metrology process 200 according to an embodiment of the present invention. The example process 200 may be used to determine whether test equipment and/or manufacturing equipment could potentially damage components mounted to printed circuit boards. For example, because testing and manufacturing equipment may twist and bend printed circuit boards, embodiments of the present invention proactively determines beforehand (i.e., before the actual test and manufacturing process) whether a particular test and manufacturing process could damage the printed circuit board and/or components mounted to the printed circuit board.

In some embodiments of the present invention in which there are several channels, each channel having a photoelectric amplifiers 114, optical fibers 116 and 118, lenses 120 and 122, and a head assembly 130, placed at different corners of the component 108, the process 200 may be implemented for each channel in the system 100. A machine-readable medium with machine-readable instructions thereon may be used to cause a processor to perform the process 200. Of course, the process 200 is only an example process and other processes may be used.

In a block 202, the PCB 102 is free from mechanical load, vibration, and/or shock and the photoelectric amplifier 114 may transmit a light beam to a corresponding target 112 through a corresponding optical fiber 116 and lens 120. The transmitted light may have a predetermined intensity (and wavelength). The lens 120 directs the transmitted light to the corresponding target 112.

In a block 204, the target 112 reflects/refracts a light beam and the lens 122 directs the reflected/refracted light beam back to the photoelectric amplifier 114 through the optical fiber 118. The reflected/refracted light beam may have a light intensity associated with the distance of the head assembly 130 from the target 112 when the PCB 102 is free from mechanical load, vibration, and/or shock.

In a block 206, the photoelectric amplifier 114 measures and converts the energy (i.e., intensity) of the reflected/refracted light beam to an analog voltage value proportional to the intensity of the reflected/refracted light beam.

In a block 208, the photoelectric amplifier 114 outputs the analog voltage value to the data acquisition system 140. In one embodiment, the photoelectric amplifier 114 outputs approximately two volts to the data acquisition system 140.

In a block 210, the data acquisition system 140 receives the analog voltage value from the photoelectric amplifier 114 and converts the analog voltage value to a digital value associated with the analog voltage value. In one embodiment, the data acquisition system 140 receives the approximately two volts from the photoelectric amplifier 114 and converts the approximately two volts to a digital value associated with the approximately two volts.

In a block 212, the data acquisition system 140 stores the digital value associated with the analog voltage value in a table 141. The table 141 may be any suitable memory in the data acquisition system 140. In one embodiment, the data acquisition system 140 stores a digital value associated with the approximately two volts in the table 141. In embodiments of the present invention in which there are several channels, there may be a separate table 141 for each channel.

In a block 214, the PCB 102 is subjected to mechanical load, vibration, and/or shock, by the test equipment 104. Alternatively, the PCB 102 may be subjected to a simulated mechanical load, vibration, and/or shock.

In a block 216, the photoelectric amplifier 114 may transmit a second light beam to the corresponding target 112 through the corresponding optical fiber 116 and lens 120. The lens 120 directs the transmitted light to the corresponding target 112.

In a block 218, the target 112 reflects/refracts a second light beam and the lens 122 directs the second reflected/refracted light beam back to the photoelectric amplifier 114 through the optical fiber 118. The second reflected/refracted light beam may have a light intensity associated with the distance the head assembly 130 from the target 112 when the PCB 102 is subjected to mechanical load, vibration, and/or shock.

The distance between the head assembly 130 and the target 112 when the PCB 102 is free from mechanical load, vibration, and/or shock may be different (e.g., less than) than the distance between the head assembly 130 and the target 112 when the PCB 102 is subject to mechanical load, vibration, and/or shock. The intensity of the first reflected/refracted light beam when the PCB 102 is free from mechanical load, vibration, and/or shock may be different than (e.g., greater than) the intensity of the second reflected/refracted light beam when the PCB 102 is subject to mechanical load, vibration, and/or shock.

In a block 220, the photoelectric amplifier 114 converts the second reflected/refracted light beam to a second analog voltage value proportional to the intensity of the second reflected/refracted light beam.

In a block 222, the photoelectric amplifier 114 outputs the second analog voltage value to the data acquisition system 140. In one embodiment, the photoelectric amplifier 114 outputs approximately seven volts to the data acquisition system 140.

In a block 224, the data acquisition system 140 receives the second analog voltage value from the photoelectric amplifier 114 and converts the second analog voltage value to a second digital value associated with the second analog voltage value. In one embodiment, the data acquisition system 140 receives the approximately seven volts from the photoelectric amplifier 114 and converts the approximately seven volts to a digital value associated with the approximately seven volts.

In a block 226, the data acquisition system 140 stores the second digital value in the table 141. In an embodiment, the data acquisition system 140 stores digital value associated with the approximately seven volts in the table 141.

In a block 228, the mechanical load, vibration, and/or shock may be removed. Alternatively, the mechanical load, vibration, and/or shock is simulated to be removed from the PCB 102.

In a block 230, the photoelectric amplifier 114 may transmit a third light beam to the corresponding target 112 through the corresponding optical fiber 116 and lens 120. The lens 120 directs the transmitted light to the corresponding target 112.

In a block 232, the target 112 reflects/refracts a third light beam and the lens 122 directs the third reflected/refracted light beam back to the photoelectric amplifier 114 through the optical fiber 118. The third reflected/refracted light beam may have a light intensity associated with the distance of the head assembly 130 from the target 112 when the load has been removed from the PCB 102.

The intensity of the third reflected/refracted light beam when the load has been removed from the PCB 102 may be different than (e.g., greater than) the intensity of the second reflected/refracted light beam when the PCB 102 is subject to mechanical load, vibration, and/or shock. The intensity of the third reflected/refracted light beam when the load has been removed from the PCB 102 may be different than (e.g., less than) the intensity of the first reflected/refracted light beam when the PCB 102 is free from mechanical load, vibration, and/or shock.

The distance between the head assembly 130 and the target 112 when the load has been removed from the PCB 102 may be different (e.g., less than) than the distance between the head assembly 130 and the target 112 when the PCB 102 is subject to mechanical load, vibration, and/or shock and different (e.g., more than) than the distance between the head assembly 130 and the target 112 when the PCB 102 is free from mechanical load, vibration, and/or shock.

In a block 234, the photoelectric amplifier 114 converts the third reflected/refracted light beam to a third analog voltage value proportional to the intensity of the third reflected/refracted light beam.

In a block 236, the photoelectric amplifier 114 outputs the third analog voltage value to the data acquisition system 140. In one embodiment, the photoelectric amplifier 114 outputs approximately four volts to the data acquisition system 140.

In a block 238, the data acquisition system 140 receives the third analog voltage value from the photoelectric amplifier 114 and converts the third analog voltage value to a third digital value associated with the third analog voltage value. In one embodiment, the data acquisition system 140 receives the approximately four volts from the photoelectric amplifier 114 and converts the approximately four volts to a digital value associated with the approximately four volts.

In a block 240, the data acquisition system 140 stores the third digital value in the table 141. In an embodiment, the data acquisition system 140 stores digital value associated with the approximately four volts in the table 141.

In a block 242, the software interface 142 receives the first, second, and third digital values from the table 141 and determines the displacement of the head assembly 130 from the target 112 before, during, and after the PCB 102 is subject to mechanical load, vibration, and/or shock based on the change among the first, second, and third digital values. Because the head assembly 130 is secured to the surface of the component 108, the software interface 142 is effectively determining the displacement of the component 108 from the PCB 102 before, during and after mechanical load, vibration, and/or shocking based on the change among the first, second, and third digital values.

In a block 244, the software interface 142 determines the PCB 102 deflection before, during, and after mechanical load, vibration, and/or shocking based on the displacement of the displacement of the head assembly 130 from the target 112 before, during and after mechanical load, vibration, and/or shocking.

In a block 246, the software interface 142 determines whether the PCB 102 deflection caused by the test equipment 106 is acceptable. Alternatively, the software interface 142 determines whether the PCB 102 deflection caused by the simulated test is acceptable.

If the PCB 102 deflection is not acceptable, control passes to block 248 and the test equipment 106 is determined to be not acceptable for testing the PCB 102. If, on the other hand, the PCB 102 deflection is acceptable, control passes to block 250 and the test equipment 106 is determined to be acceptable for testing the PCB 102. Of course, the process 200 may continue for a number of iterations.

Although described as discrete events, the transmitting/reflecting the light beams may be a continuous event that is measured at discrete time intervals. For example, measurements may be slow speed dynamic measurements.

Figure 3:
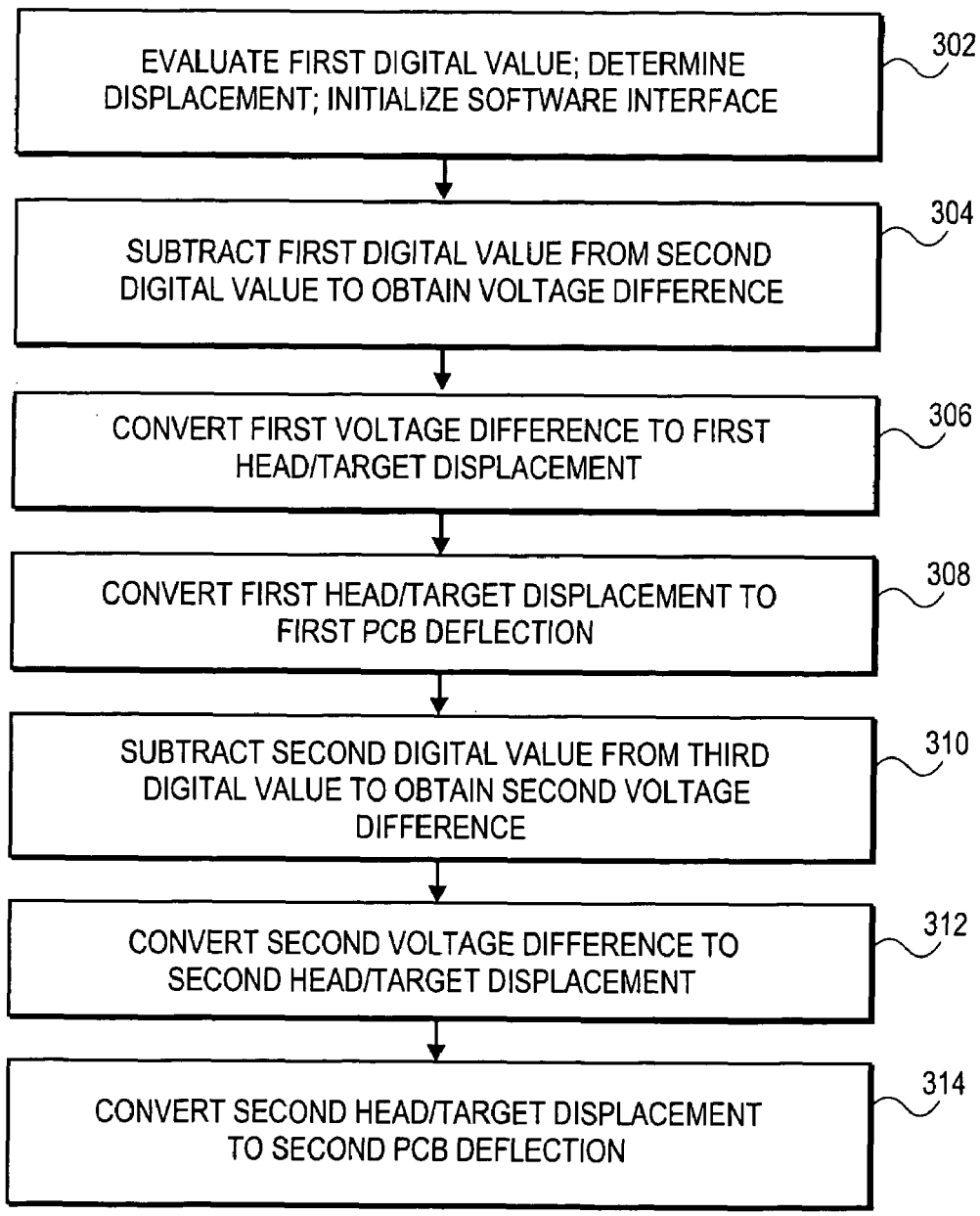
FIG. 3 is a flowchart illustrating a process the software interface illustrated in FIG. 1 may perform according to an embodiment of the present invention.

FIG. 3 is a flowchart illustrating a process 300 the software interface 142 may perform according to an alternative embodiment of the present invention. The example process 300 may be used to determine deflection of the PCB 102 based on first, second, and third digital values associated with the first, second, and third reflected/refracted light beams. A machine-readable medium with machine-readable instructions thereon may be used to cause a processor to perform the process 300.

In a block 302, the software interface 142 evaluates the first digital value, determines that the first digital value represents no displacement of the head assembly 130 from the target 112, and sets displacement equal to a value associated with no displacement. In one embodiment, the software interface 142 determines that approximately two volts represents no displacement, sets the displacement of the head assembly 130 from the target 112 equal to 0.0000 (e.g., initializes).

In a block 304, the software interface 142 subtracts the first digital value from the second digital value to obtain a voltage difference. In one embodiment, the software interface 142 subtracts approximately two volts from approximately seven volts to obtain a difference of approximately five volts.

In a block 306, the software interface 142 converts the voltage difference to a displacement of the head assembly 130 from the target 112. In one embodiment, the software interface 142 converts the approximately five-volt difference to displacement of approximately 0.001 inches.

In a block 308, the software interface 142 converts displacement of the head assembly 130 from the target 112 to deflection of the PCB 102 from the normal of the component 108. In one embodiment, the software interface 142 converts displacement of 0.001 to a deflection of approximately 0.0006 inches.

In a block 310, the software interface 142 subtracts the second digital value from the third digital value to obtain a voltage difference. In one embodiment, the software interface 142 subtracts approximately seven volts from approximately four volts to obtain a difference of approximately negative three volts.

In a block 312, the software interface 142 converts the voltage difference to a displacement of the head assembly 130 from the target 112. In one embodiment, the software interface 142 converts the approximately negative three-volt difference to displacement of approximately 0.0003 inches.

In a block 314, the software interface 142 converts displacement of the head assembly 130 from the target 112 to deflection of the PCB 102 from the normal of the component 108. In one embodiment, the software interface 142 converts displacement of the head assembly 130 from the target 112 of 0.0000 inches to deflection of the PCB 102 from the normal of the component 108 of 0.0000 inches (e.g., before mechanical load, vibration, shock). In an alternative embodiment, the software interface 142 converts displacement of the head assembly 130 from the target 112 of 0.0006 inches to deflection of the PCB 102 from the normal of the component 108 of 0.001 inches (e.g., during mechanical load, vibration, shock). In still another embodiment, the software interface 142 converts displacement of the head assembly 130 from the target 112 of 0.0003 inches to deflection of the PCB 102 from the normal of the component 108 of 0.0003 inches (e.g., after mechanical load, vibration, shock).

Figure 4:
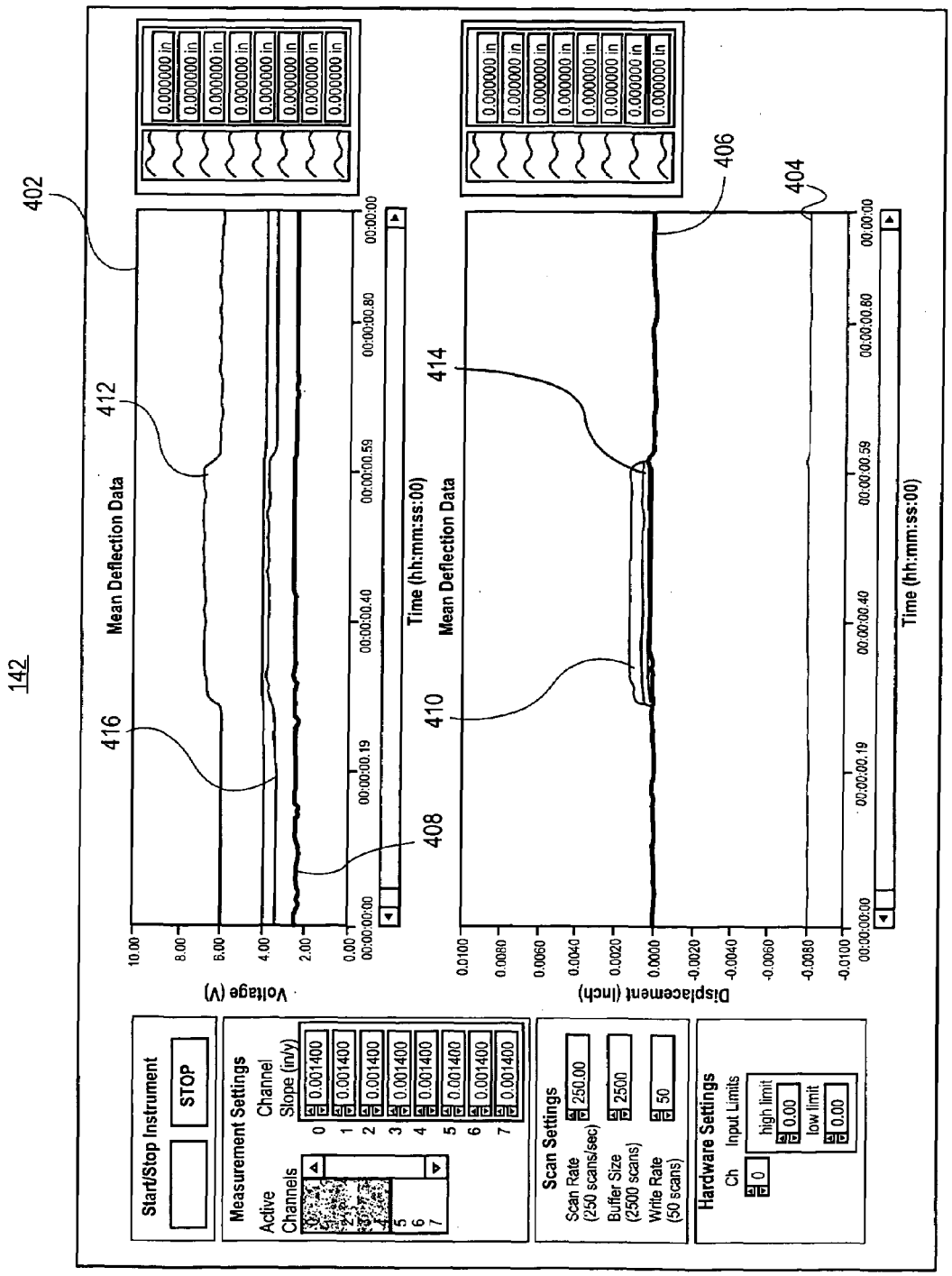
FIG. 4 is screenshot of a graphical user interface the software interface illustrated in FIG. 1 displays according to an embodiment of the present invention.

FIG. 4 is screenshot of a graphical user interface the software interface 142 displays according to an embodiment of the present invention. As the example screenshot illustrates, the graphical user interface of the software interface 142 includes a plot 402 of analog voltage versus time per channel (i.e., per photoelectric amplifier 114 output). The plot 402 includes curves 406, 410, and 414. The graphical user interface of the software interface 142 also includes a plot 404 of the displacement of the head assembly 130 from the target 112 versus time per channel. The plot 404 includes curves 408, 412, and 416.

The curve 406 represents displacement of the head assembly 130 from the target 112 of 0.0000 inches (e.g., before mechanical load, vibration, shock). The curve 408 represents analog voltage output from the photoelectric amplifier 114 to the data acquisition system 140 of two volts (e.g., before mechanical load, vibration, shock).

The curve 410 represents displacement of the head assembly 130 from the target 112 of 0.001 inches (e.g., during mechanical load, vibration, shock). The curve 412 represents analog voltage output from the photoelectric amplifier 114 to the data acquisition system 140 of approximately seven volts (e.g., during mechanical load, vibration, shock).

The curve 414 represents displacement of the head assembly 130 from the target 112 of 0.0005 inches (e.g., after removal of mechanical load, vibration, shock). The curve 412 represents analog voltage output from the photoelectric amplifier 114 to the data acquisition system 140 of approximately four volts (e.g., after removal of mechanical load, vibration, shock).

Figure 5:
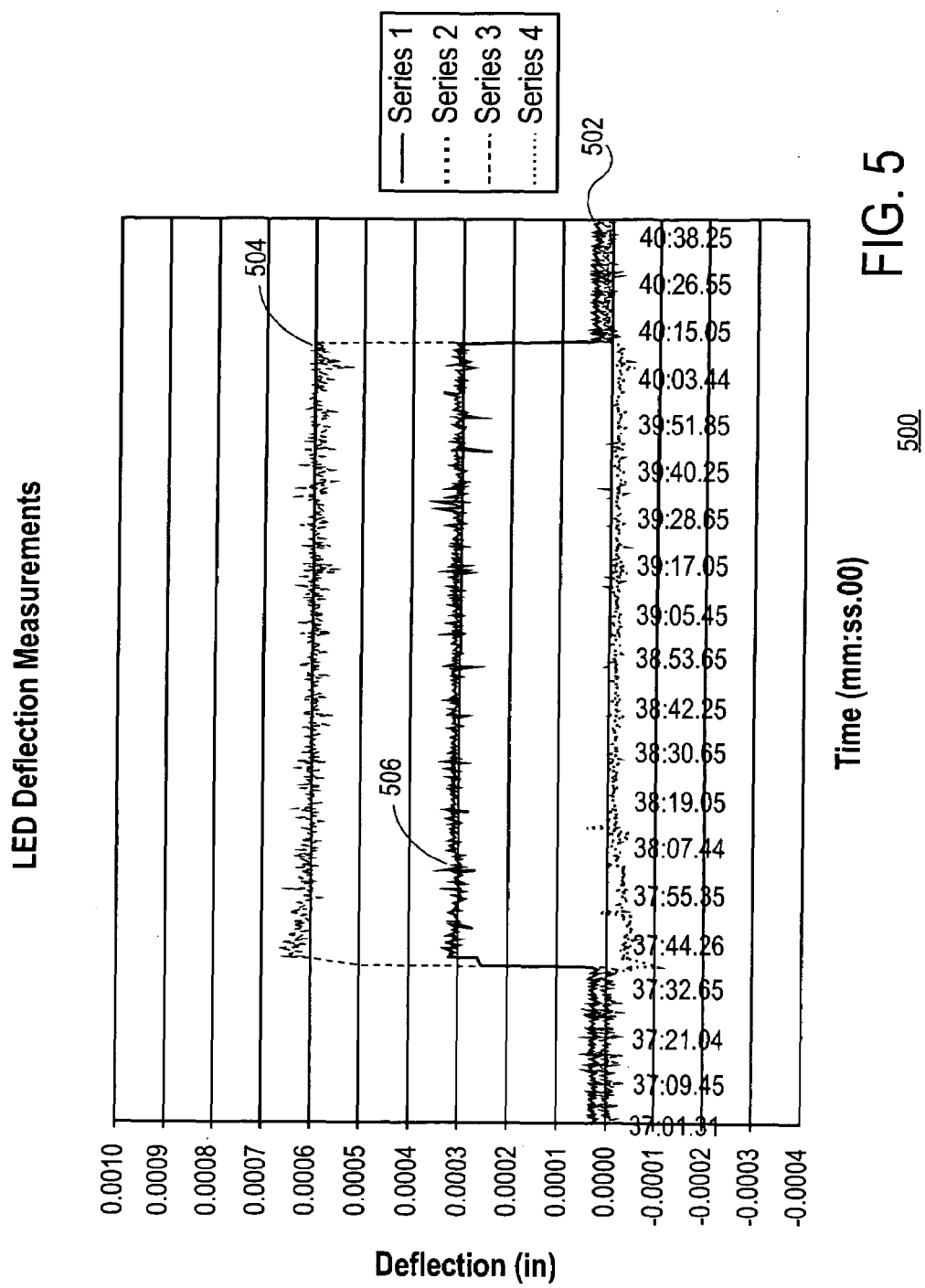
FIG. 5 is a graphical representation showing results of converting displacement of the to deflection according to one embodiment of the invention.

FIG. 5 is a graphical representation 500 showing the results of converting displacement of the head assembly 130 from the target 112 to PCB 102 deflection over time (e.g., before, during, and after subjecting the PCB 102 to mechanical load, vibration, and/or shock) based on changes in analog voltage output from the photoelectric amplifier 114 according to one embodiment of the invention.

A curve 502 illustrates a PCB 102 deflection of approximately 0.0000 inches, which corresponds to the analog output voltage of approximately two volts and a displacement of the head assembly 130 from the target 112 of approximately 0.0000 inches before subjecting the PCB 102 to mechanical load, vibration, and/or shock.

A curve 504 illustrates a PCB 102 deflection of approximately 0.0006 inches, which corresponds to the analog output voltage of approximately seven volts and a displacement of the head assembly 130 from the target 112 of approximately 0.001 inches during subjecting the PCB 102 to mechanical load, vibration, and/or shock.

A curve 506 illustrates a PCB 102 deflection of approximately 0.0003 inches, which corresponds to the analog output voltage of approximately four volts and a displacement of the head assembly 130 from the target 112 of approximately 0.0006 inches during subjecting the PCB 102 to mechanical load, vibration, and/or shock.

Embodiments of the invention can be implemented using hardware, software, firmware, or a combination of hardware and software. In implementations using software, the software may be stored on a computer program product (such as an optical disk, a magnetic disk, a floppy disk, etc.) or a program storage device (such as an optical disk drive, a magnetic disk drive, a floppy disk drive, etc.).

The above description of illustrated embodiments of the invention is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize. These modifications can be made to the invention in light of the above detailed description.

Various operations have been described as multiple discrete operations performed in turn in a manner that is most helpful in understanding embodiments of the invention. However, the order in which they are described should not be construed to imply that these operations are necessarily order dependent or that the operations be performed in the order in which the operations are presented.

Reference throughout this specification to "one embodiment" or "an embodiment" means that a particular feature, structure, process, block, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

What is claimed is:

1. A system, comprising:
a printed circuit board (PCB);
equipment adapted to mechanically load the PCB; and
optical circuitry to:
transmit a first light beam to a target on the PCB, receive a first reflected light beam from the target, before mechanical loading of the PCB, and convert the first reflected light beam to a first proportional voltage value;
receive a second reflected light beam from the target during mechanical loading of the PCB and convert the second reflected light beam to a second proportional voltage value; and
receive a third reflected light beam from the target after the mechanical loading is removed from the PCB.

2. The system of claim 1, further comprising a component mounted to the PCB.

3. The system of claim 2, wherein the component is a processor.

4. The system of claim 2, wherein the component is a surface mount technology (SMT) component.

5. The system of claim 2, wherein the component is a ball grid array (BGA) component.

6. The system of claim 2, wherein the optical circuitry comprises a head assembly mounted to the component.

7. The system of claim 6, wherein the head assembly comprises a pair of lenses inside the head assembly.

8. The system of claim 7, further comprising a pair of optical fibers coupled to the pair of lenses.

9. The system of claim 8, further comprising a photoelectric amplifier coupled to the pair of optical fibers.

10. The system of claim 9, further comprising a data acquisition system coupled to the photoelectric amplifier.

11. The system of claim 10, further comprising a software interface coupled to the data acquisition system.

12. The system of claim 11, wherein the software interface includes a graphical user interface.

13. A method, comprising:
measuring a first deflection of a printed circuit board (PCB) by receiving a first reflected light beam from a target on the PCB before mechanical loading;
mechanically loading the PCB;
measuring a second deflection of the PCB by receiving a second reflected light beam from the target during mechanical loading;
removing the mechanical load; and
measuring a third deflection of the PCB by receiving a third reflected light beam from the target after mechanical loading.

14. The method of claim 13, further comprising converting a first intensity of the first reflected light beam and a second intensity of the second reflected light beam to a first analog voltage value and a second analog voltage value, respectively.

15. The method of claim 14, further comprising converting the first analog voltage value and the second analog voltage value to a first digital value associated with the first analog voltage value and a second digital value associated with the second analog voltage value, respectively.

16. The method of claim 15, further comprising determining a displacement of the target based on the first and second digital values.

17. The method of claim 13, further comprising displaying PCB deflection on a graphical user interface.

18. The method of claim 16, further comprising displaying displacement of the target on a graphical user interface.

19. The method of claim 15, further comprising displaying the first and second analog voltage values on a graphical user interface.

* * * * *